(12) United States Patent
Wang et al.

(10) Patent No.: US 9,466,650 B2
(45) Date of Patent: Oct. 11, 2016

(54) DISPLAY PANEL WITH PIXEL DEFINING LAYER AND MANUFACTURING METHOD OF PIXEL DEFINING LAYER

(71) Applicant: BOE TECHNOLOGY GROUP CO., LTD., Beijing (CN)

(72) Inventors: Huifeng Wang, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/534,866

(22) Filed: Nov. 6, 2014

(65) Prior Publication Data

US 2016/0056218 A1 Feb. 25, 2016

(30) Foreign Application Priority Data

Aug. 22, 2014 (CN) .......................... 2014 1 0418005

(51) Int. Cl.
*H01L 51/00* (2006.01)
*H01L 27/00* (2006.01)
*H01L 27/32* (2006.01)

(52) U.S. Cl.
CPC ....... *H01L 27/3246* (2013.01); *H01L 51/0004* (2013.01)

(58) Field of Classification Search
CPC .................. H01L 51/0018; H01L 51/0026; H01L 51/56; H01L 27/3246; H01L 2227/323; H01L 27/1216; H01L 27/124
See application file for complete search history.

(56) References Cited

U.S. PATENT DOCUMENTS

| | | | | |
|---|---|---|---|---|
| 5,701,055 A | * | 12/1997 | Nagayama | .......... H01L 27/3246 313/504 |
| 7,072,096 B2 | * | 7/2006 | Holman | .................... F21S 8/08 257/E25.02 |
| 7,365,367 B2 | * | 4/2008 | Han | ..................... H01L 27/3211 257/40 |
| 8,330,359 B2 | | 12/2012 | Yoshida et al. | |
| 8,937,429 B2 | | 1/2015 | Seo et al. | |
| 9,087,763 B2 | | 7/2015 | Jiang | |
| 9,373,814 B2 | | 6/2016 | Liu et al. | |
| 2005/0287392 A1 | * | 12/2005 | Toyoda | ............... H01L 51/5048 428/690 |

FOREIGN PATENT DOCUMENTS

| | | |
|---|---|---|
| CN | 1434669 A | 8/2003 |
| CN | 101543135 A | 9/2009 |
| CN | 102705790 A | 10/2012 |
| CN | 103413819 A | 11/2013 |

OTHER PUBLICATIONS

Ohinese Office Action in Chinese Application No. 201410418005.6, mailed Jul. 5, 2016 with English translation.

* cited by examiner

*Primary Examiner* — Nikolay Yushin
(74) *Attorney, Agent, or Firm* — Collard & Roe, P.C.

(57) ABSTRACT

Embodiments of the present invention provide a display panel with a pixel defining layer and a manufacturing method of the pixel defining layer, and the display panel with the pixel defining layer comprises: a substrate; a plurality of pixel regions, arranged on the substrate in a matrix form; the pixel defining layer, disposed on the substrate and comprising: a plurality of openings; a pixel divider, surrounding each of the plurality of openings and defining the plurality of pixel regions, wherein a sidewall of the pixel divider for defining each of the pixel regions is formed so that a slope angle of an upper portion is larger than that of a lower portion thereof.

14 Claims, 4 Drawing Sheets

NESE Application No. 201410418005.6 filed on Aug. 22,
DISPLAY PANEL WITH PIXEL DEFINING LAYER AND MANUFACTURING METHOD OF PIXEL DEFINING LAYER

CROSS REFERENCE TO RELATED APPLICATIONS

Applicant claims priority under 35 U.S.C. §119 of Chinese Application No. 201410418005.6 filed on Aug. 22, 2014, the disclosure of which is incorporated by reference.

TECHNICAL FIELD

Embodiments of the present invention relate to a display panel with a pixel defining layer and a manufacturing method of the pixel defining layer.

BACKGROUND

An organic electroluminescent display has advantages of self-luminescence, fast response, wide viewing-angle, high brightness, bright color, low thickness, light weight and the like, thus, an organic electroluminescent display technology has been one of the development trends in the flat-panel display field.

Currently, an organic electroluminescent layer in the organic electroluminescent display is formed mainly by using the following two methods, wherein a first method makes use of an evaporation process, and the first method is suitable to small organic molecules and has features that the organic electroluminescent layer can be formed without a solvent, a thickness of a film is uniform, while the equipment investment is high, the material utilization is low and then the method is not suitable for production of a large-sized product; a second method: performing a process such as spin coating, ink-jet printing, nozzle coating and screen printing using a solution of organic electroluminescent material, and such methods are suitable for polymer material and small soluble molecules, and have a feature of being low equipment cost, and the methods have prominent advantages in large-scale and large-sized production. In particular, the ink-jet printing can accurately spray a solution to a pixel region, and as this method has the high material utilization and can achieve the large-sized production, it is deemed an important manner for achieving mass production of a large-sized organic electroluminescent display.

The ink-jet printing process needs to form a pixel defining layer (PDL) on a substrate in advance to define pixel regions into which ink droplets are accurately spray. Usually, a cross-section shape of the PDL is mainly a trapezoid, as shown in FIG. 1, a pixel defining layer 20 is formed on the substrate 10, an organic light emitting layer 30 is formed in a pixel region 40 defined by the pixel defining layer 20, herein a material for forming the pixel defining layer 20 is lyophobic material, thus it can be guaranteed that the ink droplets do not flow over the pixel region when the organic light emitting layer 30 is ink-jet printed. However, due to a large surface energy difference at a contact between the ink droplets and the pixel defining layer 20, a large slope angle of the PDL and a self-desiccation of the ink droplets, it is easy to form a non-uniform film with a smaller thickness at a edge and a larger thickness in the middle after drying the ink droplets, in particular, the thickness of the film is very small at an edge of the pixel region, just as shown by a region A circled by a dotted circle in FIG. 1. Therefore, a resultant structure may render a pinhole at the edge of the pixel region and thus render the electric leakage. Moreover, for the pixel defining layer shown in FIG. 1, an area of a region B of the light emitting layer 30 for emitting light is substantially equal to that of the whole pixel region 40, and because the thickness of the light emitting layer in the light emitting region B is not uniform, the brightness in the pixel region is not uniform.

SUMMARY

Embodiments of the present invention provide a display panel with a pixel defining layer and a manufacturing method of the pixel defining layer, which can improve the uniformity of a film formed by ink droplets in the pixel region, the uniformity of light emission of the pixel region, and the lifespan of an organic light emitting device.

On the one hand, an embodiment of the present invention provides a display panel with a pixel defining layer, comprising: a substrate; a plurality of pixel regions, arranged on the substrate in a matrix form; the pixel defining layer, disposed on the substrate and comprising: a plurality of openings; a pixel divider, surrounding each of the plurality of openings and defining the plurality of pixel regions, wherein a sidewall of the pixel divider for defining each of the pixel regions is formed so that a slope angle of an upper portion is larger than that of a lower portion thereof.

Optionally, in a direction toward the substrate, the slope angle of the lower portion of the sidewall of the pixel divider gradually decreases, and the slope angle of the lower portion of the sidewall of the pixel divider is substantially zero at an interface between the pixel divider and the substrate.

Optionally, the slope angle of the lower portion of the sidewall of the pixel divider is constant; and/or, the slope angle of the upper portion of the sidewall of the pixel divider is constant.

Optionally, in a direction toward the substrate, the slope angle of the upper portion of the sidewall gradually increases.

Optionally, in the direction toward the substrate, the sidewall for defining each of the pixel regions is formed so that the slope angle increases first and then decreases from an upper surface of the pixel divider to a lower surface of the pixel divider.

Optionally, the upper portion of the pixel divider is formed of lyophobic material, and the lower portion of the pixel divider is formed of lyophilic material.

Optionally, the pixel divider is formed of dual-functional pixel defining material with upper-lower opposite-property.

Optionally, the dual-functional pixel defining material with upper-lower opposite-property is a photosensitive material.

Optionally, at the lower portion, the sidewall is formed to be a smooth curved surface.

On the other hand, an embodiment of the present invention provides a manufacturing method of a pixel defining layer, and the manufacturing method comprises: providing a substrate; forming a pixel defining material layer on the substrate; patterning the pixel defining material layer through a patterning process, to form the pixel defining layer comprising a plurality of openings and a pixel divider, wherein the pixel divider surrounds each of the openings and defines pixel regions, and a sidewall of the pixel divider for defining the pixel regions is formed so that a slope angle of an upper portion is larger than that of a lower portion thereof.

Optionally, the forming the pixel defining material layer on the substrate comprises: coating a layer of dual-functional pixel defining material with upper-lower opposite-property; and the patterning the pixel defining material layer through a patterning process to form the pixel defining layer comprising the plurality of openings and the pixel divider comprises: pre-baking the pixel defining material layer; exposing the pixel defining material layer by using a mask; developing the pixel defining material layer; and post-baking the pixel defining material layer, wherein the pixel divider is lyophobic at its upper portion while is lyophilic at its lower portion.

Optionally, the coating on the substrate the layer of the dual-functional pixel defining material with upper-lower opposite-property comprises: obtaining the pixel defining material layer with a thickness of 0.1 μm-100 μm by spin coating on the substrate at a speed of 100 rpm-5000 rpm; the pre-baking the pixel defining material layer comprises: performing the pre-baking at 100° C.-200° C.; the exposing the pixel defining material layer by a mask comprises: performing the exposing under a condition that a distance between the mask and the pixel defining material layer is 5 μm-500 μm and an exposing energy is 20 mj/cm$^2$-1000 mj/cm$^2$.

Optionally, the forming the pixel defining material layer on the substrate comprises: coating a lyophilic material layer on the substrate; coating a lyophobic material layer on the lyophilic material layer; and the patterning the pixel defining material layer through a pattering process to form the pixel defining layer comprising the plurality of openings and the pixel divider comprises: patterning the lyophobic material layer and the lyophilic material layer by using a mask through a patterning process to form the plurality of openings.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
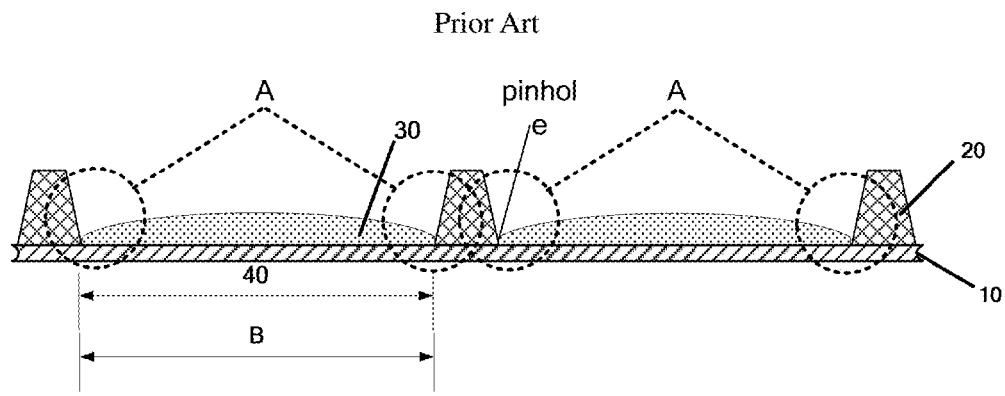
FIG. 1 is a schematic cross-section view of a current pixel defining layer structure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the present invention provide a display panel with a pixel defining layer and a manufacturing method of the pixel defining layer, and the display panel comprises: a substrate; a plurality of pixel regions, arranged on the substrate in a matrix form; and a pixel defining layer, disposed on the substrate. The pixel defining layer comprises: a plurality of openings; a pixel divider, surrounding each of the plurality of openings and defining the plurality of pixel regions, wherein a sidewall of the pixel divider for defining the pixel regions is formed so that a slope angle of an upper portion thereof is larger than that of a lower portion thereof. Due to the pixel defining layer according to the embodiments of the present invention, when the ink-jet printing technology is used to form, for example, an organic light emitting device, the thickness uniformity of a film formed by ink droplets in each of the pixel regions can be improved, and also, as the slope angle of the lower portion is smaller than the slope angle of the upper portion, a region of the pixel region in which the thickness of the film is not uniform does not emit light, the display panel according to the embodiments of the present invention has an improved light emitting uniformity of the pixel regions, thus the display quality of the display panel can be enhanced. Moreover, by making use of the pixel defining layer according to the embodiments of the present invention, a coffee ring of ink droplets occurring at an edge of the pixel divider can be partly eliminated and the electric leakage due to a pinhole can be avoided, thus the lifespan of a light emitting device in the display panel using the pixel defining layer can be improved.

It needs to be indicated that the upper portion of the sidewall of the pixel defining layer refers to a part of the sidewall of the pixel defining layer far away from the substrate and the lower portion refers to a part of the sidewall of the pixel defining layer proximate to the substrate, and there is not a clear boundary between the upper portion and the lower portion, and it may be deemed that the slope angle of the upper portion of the sidewall of the pixel defining layer is larger than that of the lower portion thereof as long as the upper portion of the sidewall of the pixel defining layer is steeper than the lower portion as a whole.

The display panel with the pixel defining layer and the manufacturing method of the pixel defining layer provided by the embodiments of the present invention will be detailed hereinafter in combination with the drawings.

A First Embodiment

Figure 2:
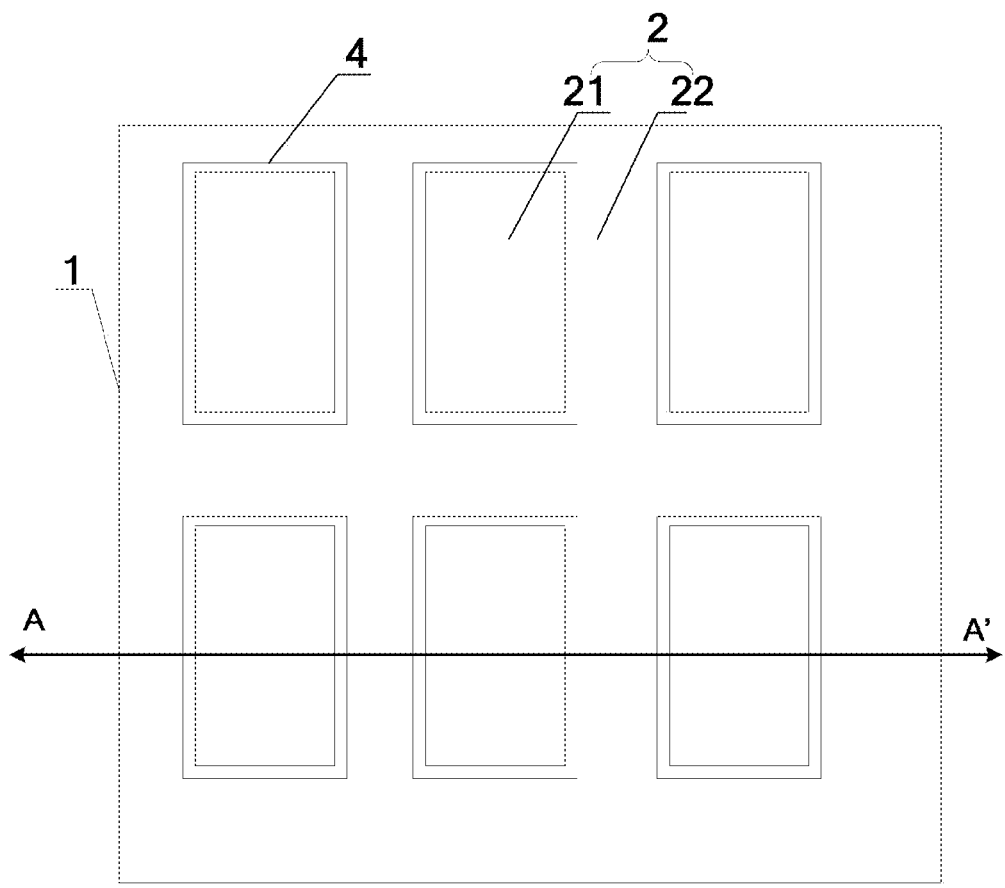
FIG. 2 is a planar view of a display panel with a pixel defining layer according to an embodiment of the present invention.

The first embodiment of the present invention provides a display panel with a pixel defining layer, and FIG. 2 is a planar view of the display panel with the pixel defining layer. In FIG. 2, a substrate 1 is formed with a plurality of pixel regions 4 thereon, and the plurality of pixel regions 4 are arranged in a matrix form, herein, to be simple, only a part of the pixel regions are shown. The pixel defining layer 2 is formed on the substrate 1 and comprises a plurality of openings 21 and a pixel divider 22 surrounding each of the openings 21 for defining each of the pixel regions 4.

Figure 3:
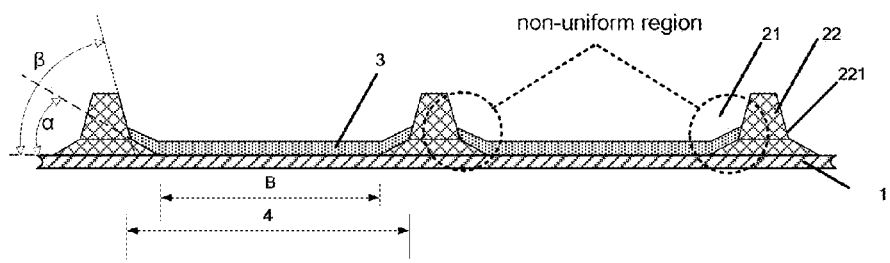
FIG. 3 is a structural cross-section view of a pixel defining layer according to an embodiment of the present invention.

FIG. 3 is a cross-section view taken along a line A-A' in FIG. 2, as shown in FIG. 3, a sidewall 221 of the pixel divider 22 for defining the pixel regions, that is, the sidewall toward the pixel region 4, is formed so that a slope angle of an upper portion is larger than that of a lower portion. Exemplarily, in the pixel region 4 defined by the opening 21, a film layer 3 is further formed on the substrate 1.

Herein, it is taken as an example that the display panel is an organic light emitting display panel, for example, the film layer 3 formed on the substrate 1 is an organic light emitting layer, as seen from FIG. 3, within each of the pixel regions 4, as the slope angle of the lower portion is smaller, the lower portion of the pixel divider 22 extends into the pixel region, therefore, only the organic light emitting layer 3 having a uniform thickness in a region B in the drawing can emit light, while the organic light emitting layer 3 out of the region B having a non-uniform film thickness does not emit light as the pixel divider interposes between the substrate 1 and the organic light emitting layer 3, therefore, the organic light emitting layer at the edge of the pixel region with the non-uniform thickness does not emit light, only the organic light emitting layer 3 having a uniform thickness emits light, thus the non-uniformity of light emission in the pixel region can be reduced.

Herein, the slope angle refers to an angle between a plane or a tangent plane of the sidewall and a horizontal plane, i.e., a plane of the substrate, and it should be noted that, if the sidewall is a curved surface, the slope angle is an angle between the tangent plane of the sidewall and the plane of the substrate.

Exemplarily, FIG. 3 shows a case in that the slope angle at the upper portion of the sidewall 221 is constant and the slope angle at the lower portion is also constant. Specifically, as shown in FIG. 3, the slope angle at the lower portion of the sidewall 221 is a, the slope angle at the upper portion of the sidewall is β, as seen from the drawing, a is far smaller than β, so that the lower portion of the sidewall extends into the pixel region 4 and then isolates the substrate 1 and the organic light emitting layer 3, and thus, a part of the organic light emitting layer 3 with a non-uniform thickness does not emit light.

Figure 4:
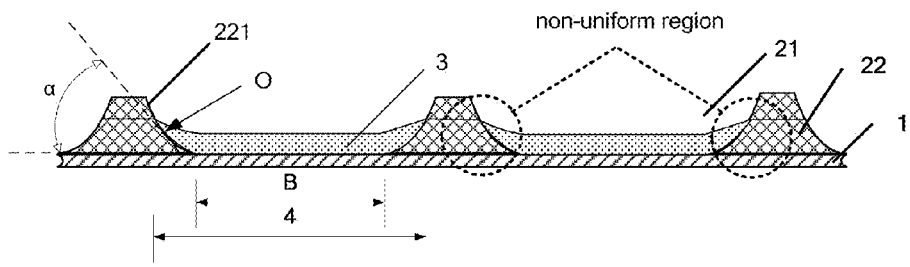
FIG. 4 is a structural cross-section view of another pixel defining layer according to an embodiment of the present invention.

Optionally, the slope angle at the lower portion of the sidewall 221 may gradually decrease along a direction toward the substrate, while the slope angle at the upper portion keeps constant. For example, as shown in FIG. 4, the lower portion of the sidewall 221 may be formed to be a smooth curved surface. Herein, a point O of the sidewall 221 is taken as an example, a slope angle at the point O, as shown in FIG. 4, is α. As seen from the drawing, the slope angle of the lower portion of the sidewall 221 at any position is smaller than the slope angle of the upper portion. Therefore, when the lower portion of the sidewall is formed to have a slope angle gradually decreasing, for example, when the lower portion is formed to be a smooth curved surface, compared with a case in that as shown in FIG. 3 the lower portion is an inclined plane having a constant slope angle, the organic light emitting layer 3 contacts smoothly with the pixel divider, so that organic light emitting material forms the corresponding light emitting layer with a smooth edge along the smooth sidewall, thus, the quality of an obtained film is further improved, and the lifespan of the organic light emitting device can be further improved and the non-uniformity of light emission of the pixel region can be improved.

Furthermore, the upper portion of the sidewall 221 may also be formed to have a slope angle gradually changing in the direction toward the substrate, for example, gradually increasing, and correspondingly, the slope angle at the lower portion of the sidewall 221 keeps constant or gradually decreases, but the slope angle at the upper portion is always larger than the slope angle at the lower portion. Exemplarily, when the slope angle at the upper portion of the sidewall gradually increases while the slope angle at the lower portion gradually decreases, in the direction toward the substrate, the sidewall 221 is formed so that the slope angle first increases and then decreases from an upper surface of the pixel divider 22 to the lower surface of the pixel divider.

Furthermore, to avoid the color mixing between the pixel regions with different colors, in the display panel with the pixel defining layer according to the embodiments of the present invention, the upper portion of the pixel divider 22 may be formed to be lyophobic and is repellent to an organic electroluminescent material solution, while the lower portion is formed to be lyophilic and is attractive to the organic electroluminescent material solution. By using the pixel divider having different wettability at upper and lower portions thereof, when the organic electroluminescent material falls on the lyophobic upper portion, the repelling effect between the two makes the organic electroluminescent material in a droplet shape easily slip back automatically to the pixel region with a corresponding color along the direction toward the substrate, which will not flow to adjacent pixel regions with other colors. Thus, the color mixing of the organic light emitting material between the pixel regions with different colors can be avoided.

Optionally, the upper portion of the pixel divider 22 may be formed of lyophobic material, and its lower portion may be formed of lyophilic material.

Exemplarily, as lyophilicity and lyophobicity are defined in view of the organic electroluminescent material, no matter the organic electroluminescent material is lyophobic or lyophilic, the upper portion of the pixel divider 22 is formed of material with a surface energy smaller than that of the organic electroluminescent material, while the lower portion of the pixel divider 22 is formed of material with a surface energy larger than that of the organic electroluminescent material. For example, when a solvent of an ink for forming the organic electroluminescent layer is glycol ether, material for forming the upper portion of the pixel divider 22 may comprise polysiloxane, hydrofluorocarbon and the like, and material for forming the lower portion of the pixel divider 22 may comprise polyamide polymer, epoxy resin and the like.

Figure 5:
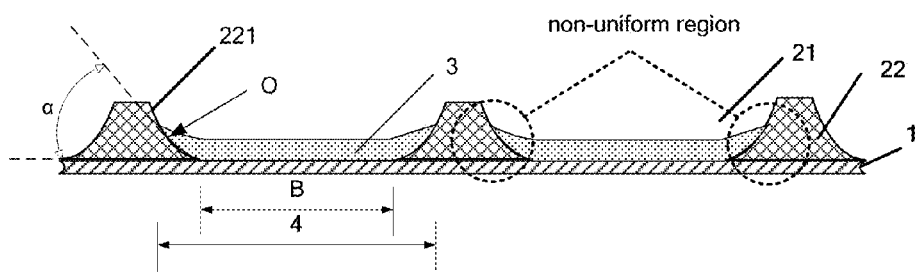
FIG. 5 is a structural cross-section view of another pixel defining layer according to an embodiment of the present invention.
Figure 6:
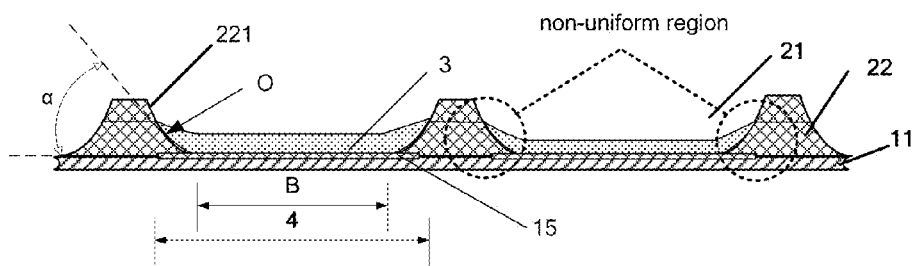
FIG. 6 is a structural cross-section view of another pixel defining layer according to an embodiment of the present invention.

Optionally, the pixel divider 22 may be formed of dual-functional pixel defining material with upper-lower opposite-property, for example, Asahi dual-functional pixel defining material, and the pixel divider 22 formed with the dual-functional pixel defining material with upper-lower opposite-property is lyophobic at the upper portion and is lyophilic at the lower portion, and please refer to FIG. 5 for specific example.

Hereinafter, the Asahi dual-functional pixel defining material is taken as an example to brief a forming process of the pixel divider with opposite properties at upper and lower portions by using the material. The pixel divider formed of the Asahi dual-functional pixel defining material is fluororesin at its upper portion and is polyimide resin at its lower portion. The fluororesin is in a form of a nanoscale low surface energy solid particle and suspends in a photoresist solvent with high surface energy when not coated. As the fluororesin has a low density and can not be dissolved in the solvent, during spin coating process and vacuum drying, the fluororesin can gradually rise to a surface of a film. A patterned dual-functional pixel defining layer is obtained through processes such as exposing and developing, then the film is thoroughly cured through a post-baking process, thus the pixel defining layer is formed which is lyophobic at the upper portion and is lyophilic at the lower portion.

Description is made above taking what is formed on the substrate is an organic light emitting layer as an example, however, for the organic light emitting display panel, each of the pixel regions is provided with one organic light emitting device (OLED), and the OLED usually comprises three layers: a cathode/anode layer, a light emitting function layer and an anode/cathode layer, and the light emitting function layer may comprise: a hole inject layer, a hole transport layer, an organic light emitting layer, an electron inject layer, an electron transport layer and etc., and each layer, for example, is formed with an ink-jet printing method. Therefore, each pixel region, besides being formed with the organic light emitting layer 3, may also be formed with the hole inject layer, the hole transport layer and etc. formed via the ink-jet printing. The above technical effect is also applicable to such layers formed by using the ink-jet printing, which is omitted herein.

Herein, it should be noted that the upper portion and the lower portion of the pixel divider and the upper portion and the lower portion of the sidewall refer to two portions of the pixel divider having different wettability, for example, the upper portion is lyophobic and the lower portion is lyophilic.

Figure 7:
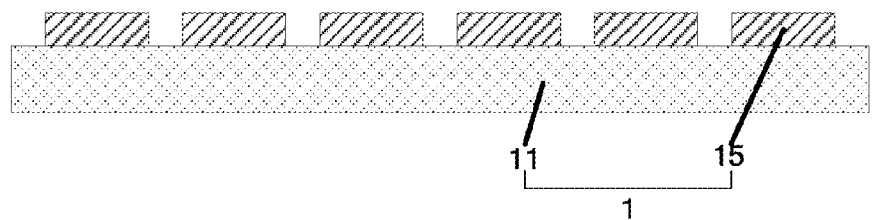
FIG. 7 is a cross-section view of a substrate before forming the pixel defining layer in a manufacturing method of a pixel defining layer according to an embodiment of the present invention.

Exemplarily, the substrate in the embodiments of the present invention is the substrate before forming the pixel defining layer, and may be a base substrate or a structure obtained by forming a plurality of films or layers on the base substrate (for example, a glass substrate, a silicon substrate, a quartz substrate and etc.). When the display panel is an organic light emitting display panel, as shown in FIG. 7, the substrate 1 comprises the base substrate 11 and the anode layer 15 deposited on the base substrate. For a bottom-emitting type OLED, it may be formed by providing a transparent anode layer and a reflective cathode layer, and for a top-emitting type OLED, it may be formed by providing a transparent cathode layer and a reflective anode layer. Therefore, different anode materials are selected depending on different device structure of the organic light emitting display, which are usually high-work-function transparent or translucent materials such as ITO, Ag, NiO, Al and graphene, and it is not limited in the embodiments of the present invention.

Exemplarily, the display panel with the pixel defining layer according to the embodiments of the present invention may also be a liquid crystal display panel, and a color filter material is filled into the openings 22 defined by the pixel divider 21 to form a patterned color filter layer. At this moment, the substrate may be an array substrate of a liquid crystal display panel or a color filter substrate, which is not limited in the embodiments of the present invention.

Herein, it should be noted that gradually increasing or decreasing of the slope angle in this specification refers to continuous or discontinuous changes of the slope angle, which is not limited in the embodiments of the present invention.

For the display panel with the pixel defining layer according to the embodiments of the present invention, the pixel defining layer comprises a pixel divider surrounding the plurality of openings, by making a slope angle at the lower portion of the sidewall of the pixel divider smaller than the slope angle at the upper portion, the sidewall of the pixel divider is extended into the pixel region and thus interposes between a substrate and a organic light emitting layer, so that a part of the organic light emitting layer at an edge of the pixel region having a non-uniform thickness does not emit light, and only a part of the organic light emitting layer having an uniform thickness emits light. Therefore, the light emitting uniformity of the pixel regions can be improved, and the display quality of the display device can be improved. Also, due to use of the pixel defining layer, when a film layer is formed by using the ink-jet printing technology, the uniformity of a film formed by ink droplets in the pixel regions can be improved, a coffee ring of the ink droplets occurring at an edge of the pixel divider can be partly eliminated and the electric leakage due to a pinhole can be avoided, thus the lifespan of a light emitting device in the display panel using the pixel defining layer can be improved.

A Second Embodiment

The second embodiment of the present invention provides a manufacturing method of the pixel defining layer according to the first embodiment.

The manufacturing method of the pixel defining layer, comprises:

Step S101, providing a substrate.

The substrate in the embodiment of the present invention is a substrate before forming the pixel defining layer, and may be a base substrate or a structure obtained by forming a plurality of films or layers on the base substrate. The base substrate may be a glass substrate, a silicon substrate or the quartz substrate. For example, as shown in FIG. 7, the substrate comprises the base substrate 11 and the anode layer 15 formed on the base substrate 11. As an example, the following description takes it as an example that the substrate 1 comprises the base substrate 11 and the anode layer 15 formed on the base substrate 11.

Step S102, forming a pixel defining material layer on the substrate 1.

In this step, a method of forming the pixel defining material layer may be chemical vapor deposition (CVD), spin coating or blade coating, and the embodiments of the present invention do not limit this, and the method may be selected according to a material of a film layer to be formed.

Step 103, patterning the pixel defining material layer through a patterning process, to form the pixel defining layer comprising a plurality of openings and a pixel divider, wherein, each of the openings, for example, corresponds to each or a plurality of the pixel regions, and the pixel divider surrounds each of the openings, and a sidewall of the pixel divider for defining the pixel regions is formed so that the slope angle of an upper portion is larger than that of a lower portion, as shown in FIG. 3.

Herein, the patterning process in the embodiments of the present invention may at least comprise processes such as exposing, developing and etching (wet etching or dry etching).

Exemplarily, the slope angle at the lower portion of the sidewall of the pixel divider may gradually decrease in a direction toward the substrate, while the slope angle at the upper portion keeps constant or gradually increases in the direction toward the substrate; or, the slope angle at the lower portion of the sidewall of the pixel divider may keep constant, while the slope angle at the upper portion is also constant or gradually increases in the direction toward the substrate.

Exemplarily, when the slope angle at the upper portion of the sidewall gradually increases while the slope angle at the lower portion gradually decreases, in the direction toward the substrate, the sidewall of the pixel divider is formed so that the slope angle first increases and then decreases from an upper surface of the pixel divider to a lower surface of the pixel divider.

Optionally, the lower portion of the sidewall of the pixel divider is formed to be a smooth curved surface, which can further improve the quality of a film.

Figure 10:
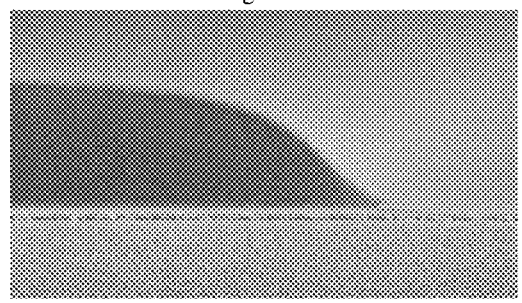
FIGS. 10($a$), 10($b$) and 10($c$) are cross-section views of a pixel defining layer obtained after exposing the pixel defining material layer formed with the dual-functional pixel defining material with upper-lower opposite-property respectively at exposing energies of 180 mj/cm$^2$, 200 mj/cm$^2$ and 220 mj/cm$^2$ in the manufacturing method of the pixel defining layer according to an embodiment of the present invention.
Figure 10:
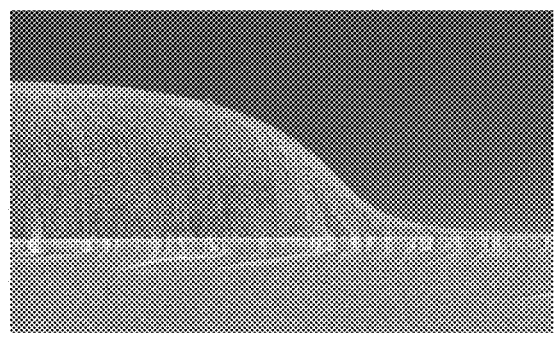
Figure 10:
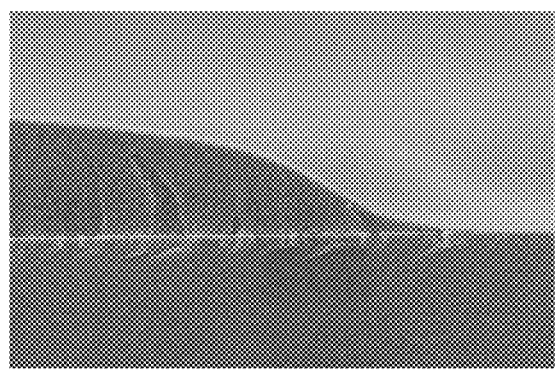

Exemplarily, the sidewall of the pixel divider is formed so that the slope angle first increases and then decreases from the upper surface of the pixel divider to the lower surface of the pixel divider, and when the lower portion of the sidewall of the pixel divider is formed to be a smooth curved surface, the upper portion of the pixel divider may also be formed to be a smooth curved surface extending upward from the lower portion of the sidewall, and the upper surface of the pixel divider may be formed to be a smooth curved surface extending upward from the upper portion of the sidewall, as shown in FIGS. 10(a) to 10(c).

Furthermore, the upper portion of the pixel divider may be formed to be lyophobic and is repellent to an organic electroluminescent material solution, while the lower portion is formed to be lyophilic and is attractive to the organic electroluminescent material solution. Exemplarily, the upper portion of the pixel divider may be formed of a lyophobic material, and its lower portion may be formed of a lyophilic material; or, the pixel divider may be formed of dual-functional pixel defining material with upper-lower opposite-property, for example, an Asahi dual-functional pixel defining material, and the pixel divider formed of the dual-functional pixel defining material with upper-lower opposite-property is lyophobic at the upper portion and is lyophilic at the lower portion.

Hereinafter, the manufacturing method of the pixel defining layer is detailed taking it as an example that the pixel defining layer is formed of the dual-functional pixel defining material with upper-lower opposite-property.

After preparing the substrate 1, the following steps are performed.

Figure 8:
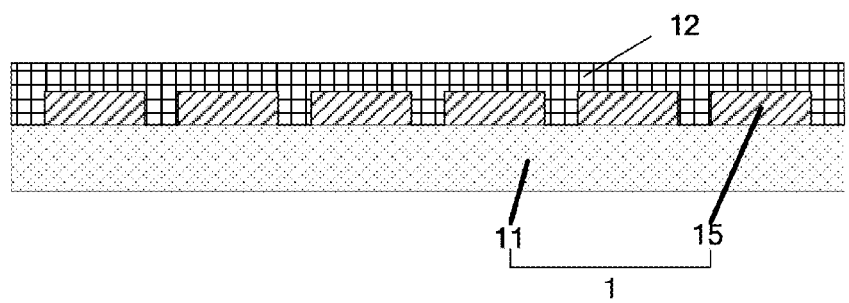
FIG. 8 is a cross-section view after forming the pixel defining material layer in the manufacturing method of pixel defining layer according to an embodiment of the present invention.

Step S102, forming the pixel defining material layer on the substrate 1 comprises:

Forming a dual-functional pixel defining material layer 12 by coating the dual-functional pixel defining material with upper-lower opposite-property on the substrate 1 as shown in FIG. 8.

For example, a photoresist film, for example, a Asahi dual-functional pixel defining material layer, is coated on the substrate shown in FIG. 7 through spin coating, blade coating and etc., and a thickness of the photoresist film is 0.1 μm-100 μm, for example, 1 μm-5 μm.

For example, the photoresist film may be formed through spin coating at a rotation speed of 100 rpm-5000 rpm. For the spin coating, the higher the rotation speed is, the thinner the formed photoresist film is, and a suitable rotation speed of spin coating may be selected according to the thickness of the photoresist film to be formed, which is not limited in the embodiments of the present invention.

Step S103, patterning the pixel defining material layer through a patterning process to form the pixel defining layer comprising a plurality of openings and a pixel divider.

An example of step 103 comprises:

pre-baking the dual-functional pixel defining material layer;

exposing the dual-functional pixel defining material layer by using a mask;

developing the dual-functional pixel defining material layer; and post-baking the dual-functional pixel defining material layer.

Figure 9:
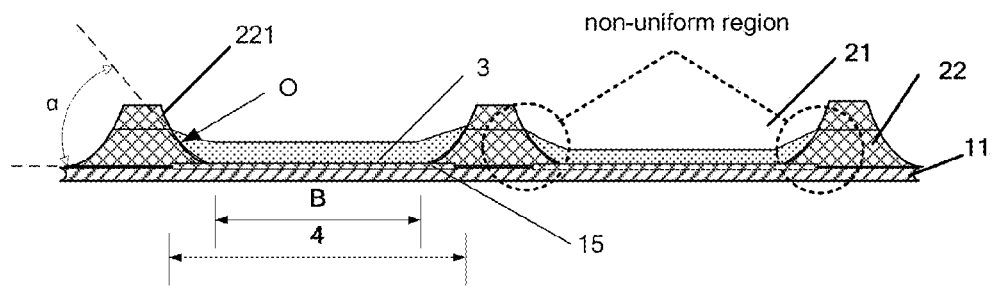
FIG. 9 is a cross-section view after forming the pixel defining layer in the manufacturing method of the pixel defining layer according to an embodiment of the present invention.

The pixel divider is lyophobic at its upper portion while is lyophilic at its lower portion, and FIG. 9 shows an exemplary structure of the pixel divider.

Exemplarily, during the pre-baking, a pre-baking temperature may be 100° C.-200° C., herein, the higher the pre-baking temperature is, the larger a maximum slope angle of the lower portion of the sidewall is. Therefore, the pre-baking temperature may be suitably selected according to the slope angle to be formed, and the embodiments of the present invention do not limit this.

Exemplarily, process conditions of exposing the dual-functional pixel defining material layer by using a mask are as follow: a distance between the mask and the dual-functional pixel defining material layer to be exposed is 5 μm-500 μm; and an exposing energy may be 20 mj/cm²-1000 mj/cm². Usually, the larger the distance between the mask and the dual-functional pixel defining material layer is, the smaller the maximum slope angle at the lower portion of the sidewall of the pixel divider is, and the larger the exposing energy is, the smaller the maximum slope angle at the lower portion of the sidewall is, and the exposing energy also varies in view of different dual-functional pixel defining materials, and the embodiments of the present invention do not limit this, those skilled in the art may make choices according to actually selected dual-functional pixel defining material and the pixel defining layer structure to be formed.

For example, to make the lower portion of the sidewall of the pixel divider be formed as a smooth curved surface with a gradually decreasing slope angle, the pixel defining material layer with a thickness of 1.5 μm may be obtained by spin coating for 20 s at a rotation speed of 600 rpm, then the obtained pixel defining material layer is pre-baked at 100° C. for 120 s, then is exposed by using a mask under conditions that the distance between the mask and the pixel defining material layer to be exposed is 50 μm and the exposing energies are 180 mj/cm², 200 mj/cm² and 220 mj/cm², respectively, thus the expected structures of the pixel divider are obtained, and FIGS. 10(a), 10(b) and 10(c) are respectively scanning electron microscope (SEM) cross-section views of the pixel divider obtained at the exposing energies of 180 mj/cm², 200 mj/cm² and 220 mj/cm². Seen from FIGS. 10(a)-10(c), with the increasing of the exposing energy, the maximum slope angle at the lower portion of the pixel divider decreases, and a trail of the formed pixel divider at the exposing energy of 220 mj/cm² is large.

Herein, through accurate adjustment of the pre-baking temperature, the exposing energy, the distance between the mask and the film layer to be exposed, the post-baking temperature and etc., a pixel divider may be obtained with a slope angle at the lower portion of the sidewall being smaller than that at the upper portion thereof, for example, the gradually decreasing slope angle at the lower portion.

Exemplarily, the manufacturing method of the pixel defining layer which is lyophobic at the upper portion and is lyophilic at the lower portion by using two materials will be described hereinafter.

After providing the substrate 1, forming the pixel defining material layer on the substrate 1 comprises:

coating a lyophilic material layer on the substrate 1;

coating a lyophobic material layer on the lyophilic material layer; and patterning the lyophobic material layer and the lyophilic material layer with a mask through a patterning process, to form a plurality of openings.

Figure 11:
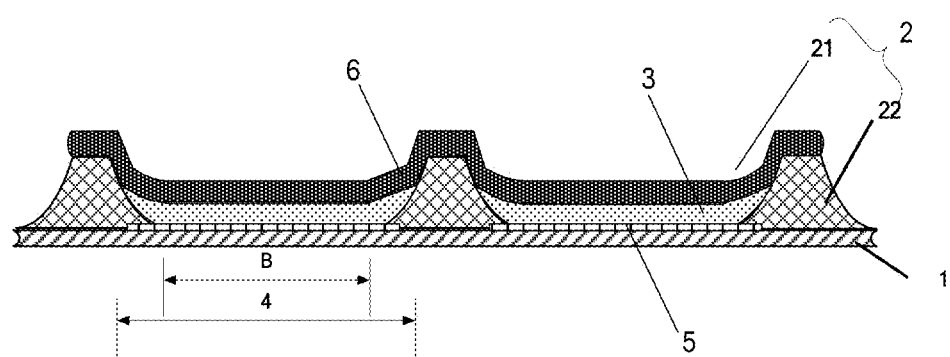
FIG. 11 is a cross-section view of an organic light emitting display panel further formed after forming the pixel defining layer in the manufacturing method of the pixel defining layer according to an embodiment of the present invention.

Furthermore, if the display panel using the pixel defining layer is an organic light emitting display panel, after forming the pixel defining layer, it is also necessary to form a light emitting functional layer by using the ink-jet printing, for example, the light emitting functional layer comprises a hole inject layer, a hole transfer layer, an organic light emitting layer, an electron transfer layer, an electron inject layer and etc. Then, a cathode layer/anode layer 6 is evaporated on the light emitting functional layer, as shown in FIG. 11.

Exemplarily, if the display panel using the pixel defining layer is a liquid crystal display panel, after forming the pixel defining layer, it is also necessary to fill various color filter materials into the openings of the pixel defining layer to form a patterned color filter layer.

For the display panel with the pixel defining layer and the manufacturing method of the pixel defining layer according to the embodiments of the present invention, the pixel defining layer comprises: a plurality of openings; and a pixel divider, surrounding each of the plurality of openings and defining a plurality of pixel regions, and a sidewall of the pixel divider for defining each of the pixel regions is formed so that a slope angle of an upper portion is larger than that of a lower portion. Due to use of such pixel defining layer, when the ink-jet printing technology is used to form, for example, an organic light emitting device, the uniformity of a film formed by ink droplets in the pixel regions can be improved, and also, as the slope angle at the lower portion is smaller than the slope angle at the upper portion, a part of the pixel region in which a thickness of the light emitting layer is not uniform does not emit light, the display panel according to the embodiments of the present invention has the improved light emitting uniformity of the pixel region, thus the display quality of the display panel can be enhanced. Moreover, Due to the pixel defining layer according to the embodiments of the present invention, a coffee ring of ink droplets occurring at an edge of the pixel divider can be partly eliminated and the electric leakage due to a pinhole can be avoided, thus the lifespan of a light emitting device in the display panel using the pixel defining layer can be improved.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The present application claims priority to China patent application number CN201410418005.6 filed on Aug. 22, 2014, which is incorporated herein by reference in its entirety.

The invention claimed is:

1. A display panel with a pixel defining layer, comprising:
a substrate;
a plurality of pixel regions, arranged on the substrate in a matrix form;
the pixel defining layer, disposed on the substrate and comprising:
a plurality of openings;
a pixel divider, surrounding each of the plurality of openings and defining the plurality of pixel regions,
wherein a sidewall of the pixel divider for defining each of the pixel regions is formed so that a slope angle of an upper portion is larger than that of a lower portion thereof,
wherein, in the direction toward the substrate, the sidewall for defining each of the pixel regions is formed so that the slope angle increases first and then decreases from an upper surface of the pixel divider to a lower surface of the pixel divider,
wherein, the slope angle of the lower portion of the sidewall of the pixel divider is substantially zero at an interface between the pixel divider and the substrate.

2. The display panel with the pixel defining layer according to claim 1, wherein, a height of the pixel divider is 1 µm-5 µm.

3. The display panel with the pixel defining layer according to claim 1, wherein, in a direction toward the substrate, the slope angle of the lower portion of the sidewall of the pixel divider gradually decreases.

4. The display panel with the pixel defining layer according to claim 3, wherein, in a direction toward the substrate, the slope angle of the upper portion of the sidewall gradually increases.

5. The display panel with the pixel defining layer according to claim 3, wherein, at the lower portion, the sidewall is formed to be a smooth curved surface.

6. The display panel with the pixel defining layer according to claim 1, wherein, the upper portion of the pixel divider is lyophobic and the lower portion of the pixel divider is lyophilic.

7. The display panel with the pixel defining layer according to claim 6, wherein, the upper portion of the pixel divider is formed of lyophobic material, and the lower portion of the pixel divider is formed of lyophilic material.

8. The display panel with the pixel defining layer according to claim 6, wherein, the pixel divider is formed of dual-functional pixel defining material with upper-lower opposite-property.

9. The display panel with the pixel defining layer according to claim 8, wherein, the dual-functional pixel defining material with upper-lower opposite-property is a photosensitive material.

10. A manufacturing method of a pixel defining layer, comprising:
providing a substrate;
forming a pixel defining material layer on the substrate;
patterning the pixel defining material layer through a patterning process, to form the pixel defining layer comprising a plurality of openings and a pixel divider,
wherein the pixel divider surrounds each of the openings and defines pixel regions, and a sidewall of the pixel divider for defining the pixel regions is formed so that a slope angle of an upper portion is larger than that of a lower portion thereof, wherein, in the direction toward the substrate, the sidewall for defining each of the pixel regions is formed so that the slope angle increases first and then decreases from an upper surface of the pixel divider to a lower surface of the pixel divider, wherein, the slope angle of the lower portion of the sidewall is substantially zero at an interface between the pixel divider and the substrate.

11. The manufacturing method of the pixel defining layer according to claim 10, wherein, the forming the pixel defining material layer on the substrate comprises:
coating a lyophilic material layer on the substrate;
coating a lyophobic material layer on the lyophilic material layer; and
the patterning the pixel defining material layer through a pattering process to form the pixel defining layer comprising the plurality of openings and the pixel divider comprises:
patterning the lyophobic material layer and the lyophilic material layer by using the mask through a patterning process to form the plurality of openings.

12. The manufacturing method of the pixel defining layer according to claim 10, wherein, in a direction toward the substrate, the slope angle of the lower portion of the sidewall gradually decreases.

13. The manufacturing method of the pixel defining layer according to claim 10, wherein, the forming the pixel defining material layer on the substrate comprises:
coating a layer of dual-functional pixel defining material with upper-lower opposite-property on the substrate; and
the patterning the pixel defining material layer through a patterning process to form the pixel defining layer comprising the plurality of openings and the pixel divider comprises:
pre-baking the pixel defining material layer;
exposing the pixel defining material layer by using a mask;
developing the pixel defining material layer; and
post-baking the pixel defining material layer,
wherein the pixel divider is lyophobic at its upper portion while is lyophilic at its lower portion.

14. The manufacturing method of the pixel defining layer according to claim 13, wherein, the coating the layer of the dual-functional pixel defining material with upper-lower opposite-property on the substrate comprises: obtaining the pixel defining material layer with a thickness of 0.1 μm-100 μm by spin coating on the substrate at a speed of 100 rpm-5000 rpm;
the pre-baking the pixel defining material layer comprises: performing the pre-baking at 100° C.-200° C.;
the exposing the pixel defining material layer by using a mask comprises: performing the exposing under a condition that a distance between the mask and the pixel defining material layer is 5 μm-500 μm and an exposing energy is 20 mj/cm$^2$-1000 mj/cm$^2$.

* * * * *